US008107910B2

(12) United States Patent
Hadjichristos

(10) Patent No.: US 8,107,910 B2
(45) Date of Patent: Jan. 31, 2012

(54) DIFFERENTIAL TO SINGLE-ENDED CONVERSION FOR RADIO FREQUENCY DEVICES

(75) Inventor: Aristotele Hadjichristos, Cary, NC (US)

(73) Assignee: QUALCOMM, Incorporated, San Diego, CA (US)

( * ) Notice: Subject to any disclaimer, the term of this patent is extended or adjusted under 35 U.S.C. 154(b) by 837 days.

(21) Appl. No.: 11/847,252

(22) Filed: Aug. 29, 2007

(65) Prior Publication Data

US 2009/0061803 A1 Mar. 5, 2009

(51) Int. Cl.
*H04B 1/06* (2006.01)
*H04B 7/00* (2006.01)
(52) U.S. Cl. ............... 455/232.1; 455/127.2; 455/250.1
(58) Field of Classification Search ............... 455/127.3, 455/253.2, 311, 341, 313, 234.2, 232.1, 574, 455/127.5, 127.2, 250.1, 343.1, 343.5; 327/108, 327/407; 330/252, 254
See application file for complete search history.

(56) References Cited

U.S. PATENT DOCUMENTS

| | | | | |
|---|---|---|---|---|
| 5,606,268 A * | 2/1997 | Van Brunt | ................ | 326/68 |
| 5,903,827 A | 5/1999 | Kennan et al. | | |
| 6,150,852 A * | 11/2000 | Aparin | ................ | 327/103 |
| 6,177,832 B1 * | 1/2001 | Durec et al. | ................ | 327/563 |
| 6,606,489 B2 * | 8/2003 | Razavi et al. | ................ | 455/323 |
| 6,809,566 B1 * | 10/2004 | Xin-LeBlanc | ................ | 327/156 |
| 6,904,103 B2 | 6/2005 | Okanobu | | |
| 6,920,187 B2 * | 7/2005 | Penney | ................ | 375/316 |
| 7,457,605 B2 * | 11/2008 | Thompson et al. | ................ | 455/313 |
| 7,564,293 B2 * | 7/2009 | Watanabe | ................ | 327/407 |
| 7,724,039 B2 * | 5/2010 | Arai | ................ | 327/70 |
| 2005/0005296 A1 | 1/2005 | Bargroff et al. | | |
| 2005/0130615 A1 | 6/2005 | Darabi | | |
| 2006/0214719 A1 | 9/2006 | Watanabe | | |
| 2007/0064833 A1 | 3/2007 | Sahota | | |
| 2008/0074179 A1 * | 3/2008 | Arai | ................ | 327/563 |

FOREIGN PATENT DOCUMENTS

| | | |
|---|---|---|
| EP | 0752756 A2 | 1/1997 |
| GB | 2106345 A | 4/1983 |
| JP | 57125506 A | 8/1982 |
| JP | 58148508 A | 9/1983 |
| JP | 1302908 A | 12/1989 |
| JP | 9107243 A | 4/1997 |
| JP | 2005229459 A | 8/2005 |
| KR | 20020012129 A | 2/2002 |

OTHER PUBLICATIONS

International Search Report and Written Opinion—PCT/US2008/074660, International Search Authority—European Patent Office—Mar. 11, 2008.
Taiwan Search Report—TW097133318—TIPO—Jul. 14, 2011.

* cited by examiner

*Primary Examiner* — Sonny Trinh
(74) *Attorney, Agent, or Firm* — Ramin Mobarhan

(57) ABSTRACT

In an exemplary embodiment, a circuit is disclosed comprising a plurality of inputs, each input to receive a radio frequency waveform from a plurality of differential input waveforms having different phases; and an inverter circuit to invert a waveform from the plurality of differential inputs waveforms to a substantially same phase as a non-inverted input waveform. The circuit further comprises a combiner node to combine the inverted and the non-inverted input waveforms into an output waveform.

21 Claims, 12 Drawing Sheets

DIFFERENTIAL TO SINGLE-ENDED CONVERSION FOR RADIO FREQUENCY DEVICES

BACKGROUND

I. Field

The present disclosure relates generally to radio frequency devices, and more specifically to techniques for reducing the size and the power consumption of a radio frequency device.

II. Background

Radio-frequency based communication networks, such as voice and data transfer networks, are widely deployed in both wire and wireless environments, such as cell phones and cable set-top-boxes, to provide various services such as voice, video, packet data, messaging, broadcast, etc. These networks may be multiple-access networks capable of supporting multiple users by sharing the available network resources. Examples of such multiple-access networks in the wireless field for example include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

In radio-frequency based communication networks it is desirable to use radio-frequency transmitter integrated circuits that have single-ended radio-frequency outputs to achieve better efficiency in both area and number of components used. This reduces the number of pins and the number of external components. Multi-band and multi-mode solutions often use several transmitter paths so keeping single-ended RF outputs becomes of importance.

Currently, analog and/or radio-frequency integrated circuits, such as radio-frequency transmitter circuits, rely on differential (balanced) circuit architectures to accomplish better noise immunity, high carrier suppression and high isolation. A differential to single-ended conversion circuit is then often used between the differential input stage and the single-ended output stage. This differential to single-ended conversion for radio-frequency transmitter circuits is normally accomplished with the use of passive transformers which re-phase and the sum two differential signals. A shortcoming of the foregoing approach is that passive transformers are often large in area, require tuning to operate for different frequency bands, and in some cases more than one transformer is required for a complicated transmitter that has different signal paths. For example, the typical die area of such a transformer is about 600 um×600 um. A dual band solution could require two transformers requiring a total silicon area equal to 0.72 mm$^2$. These transformers thus not only occupy relatively large silicon die area but also can couple magnetically to other sensitive circuits such as voltage controlled oscillators (VCO), low noise amplifiers (LNA)s etc. to cause interferences with these circuit, such as in the form of added noise.

Accordingly, there is a need in the art for radio-frequency based integrated circuits that have single-ended, radio-frequency outputs, but which achieve better efficiency in both area and number of components used, as well as current consumption.

DETAILED DESCRIPTION

The techniques described herein may be used for various wireless communication networks such as CDMA, TDMA, FDMA, OFDMA and SC-FDMA networks. The terms "network" and "system" are often used interchangeably. A CDMA network may implement a radio technology such as Universal Terrestrial Radio Access (UTRA), cdma2000, etc. UTRA includes Wideband-CDMA (W-CDMA), Low Chip Rate (LCR), High Chip Rate (HCR), etc. cdma2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. These various radio technologies and standards are known in the art. UTRA, E-UTRA and GSM are described in documents from an organization named "3rd Generation Partnership Project" (3GPP). Cdma2000 is described in documents from an organization named "3rd Generation Partnership Project 2" (3GPP2). 3GPP and 3GPP2 documents are publicly available. For clarity, certain aspects of the techniques are described below for 3GPP networks.

The word "exemplary" is used herein to mean "serving as an example, instance, or illustration." Any embodiment described herein as "exemplary" is not necessarily to be construed as preferred or advantageous over other embodiments.

It should be noted that the exemplary embodiments described herein are presented in the context of a wireless environment for exemplary purposes only, and are not meant to be limited to such, but applicable to any wire or wireless setting which use radio-frequency transmission and reception, such as cell-phones, base-stations, as well as cable set-top boxes and the likes.

Figure 1:
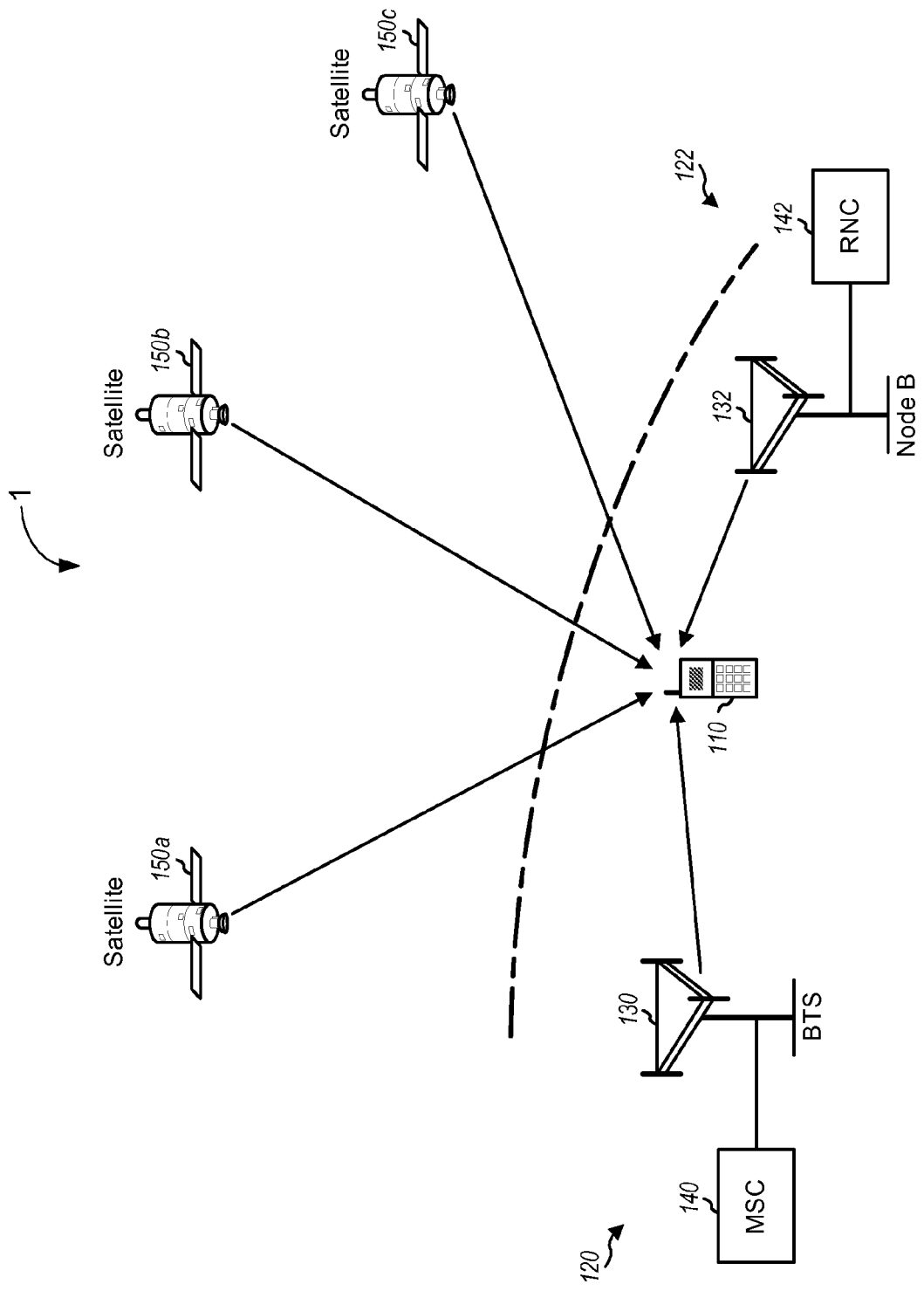
FIG. 1 illustrates an exemplary wireless communication environment in which exemplary embodiments of the disclosure can be practiced.

FIG. 1 illustrates an exemplary wireless communication environment 1 comprising communication systems 120 and 122 and a wireless device 110, such as a multi-antenna wireless device capable of communicating with multiple wireless communication systems 120 and 122. Wireless system 120 may be a CDMA system that may implement one or more CDMA standards such as, e.g., IS-2000 (commonly referred to as CDMA 1×), IS-856 (commonly referred to as CDMA 1× EV-DO), IS-95, W-CDMA, and so on. Wireless system 120 includes a base transceiver system (BTS) 130 and a mobile switching center (MSC) 140. BTS 130 provides over-the-air communication for wireless devices under its coverage area. MSC 140 couples to BTSs in wireless system 120 and provides coordination and control for these BTSs. Wireless system 122 may be a TDMA system that may implement one or more TDMA standards such as, e.g., GSM. Wireless system 122 includes a Node B 132 and a radio network controller (RNC) 142. Node B 132 provides over-the-air communication for wireless devices under its coverage area. RNC 142 couples to Node Bs in wireless system 122 and provides coordination and control for these Node Bs. In general, BTS 130 and Node B 132 are fixed stations that provide communication coverage for wireless devices and may also be referred to as base stations or some other terminology. MSC 140 and RNC 142 are network entities that provide coordination and control for the base stations and may also be referred to by other terminologies.

Wireless device 110 may be a cellular phone, a personal digital assistant (PDA), a wireless-enabled computer, or some other wireless communication unit or device. Wireless device 110 may also be referred to as a mobile station (3GPP2 terminology), a user equipment (UE) (3GPP terminology), an access terminal, or some other terminology. Wireless device 110 is equipped with multiple antennas, e.g., one external antenna and one or more internal antennas. The multiple antennas may be used to provide diversity against deleterious path effects such as fading, multipath, interference, and so on. An RF modulated signal transmitted from an antenna at a transmitting entity may reach the multiple antennas at wireless device 110 via line-of-sight paths and/or reflected paths. At least one propagation path typically exists between the transmit antenna and each receive antenna at wireless device 110. If the propagation paths for different receive antennas are independent, which is generally true to at least an extent, then diversity increases and the received signal quality improves when multiple antennas are used to receive the RF modulated signal.

Wireless device 110 may or may not be capable of receiving signals from satellites 150. Satellites 150 may belong to a satellite positioning system such as the well-known Global Positioning System (GPS), the European Galileo system, or some other systems. Each GPS satellite transmits a GPS signal encoded with information that allows a GPS receiver on Earth to measure the time of arrival (TOA) of the GPS signal. Measurements for a sufficient number of GPS satellites may be used to obtain an accurate three-dimensional position estimate for the GPS receiver. In general, the wireless device 110 may be capable of communicating with any number of wireless systems of different wireless technologies (e.g., CDMA, GSM, GPS, and so on).

Figure 2:
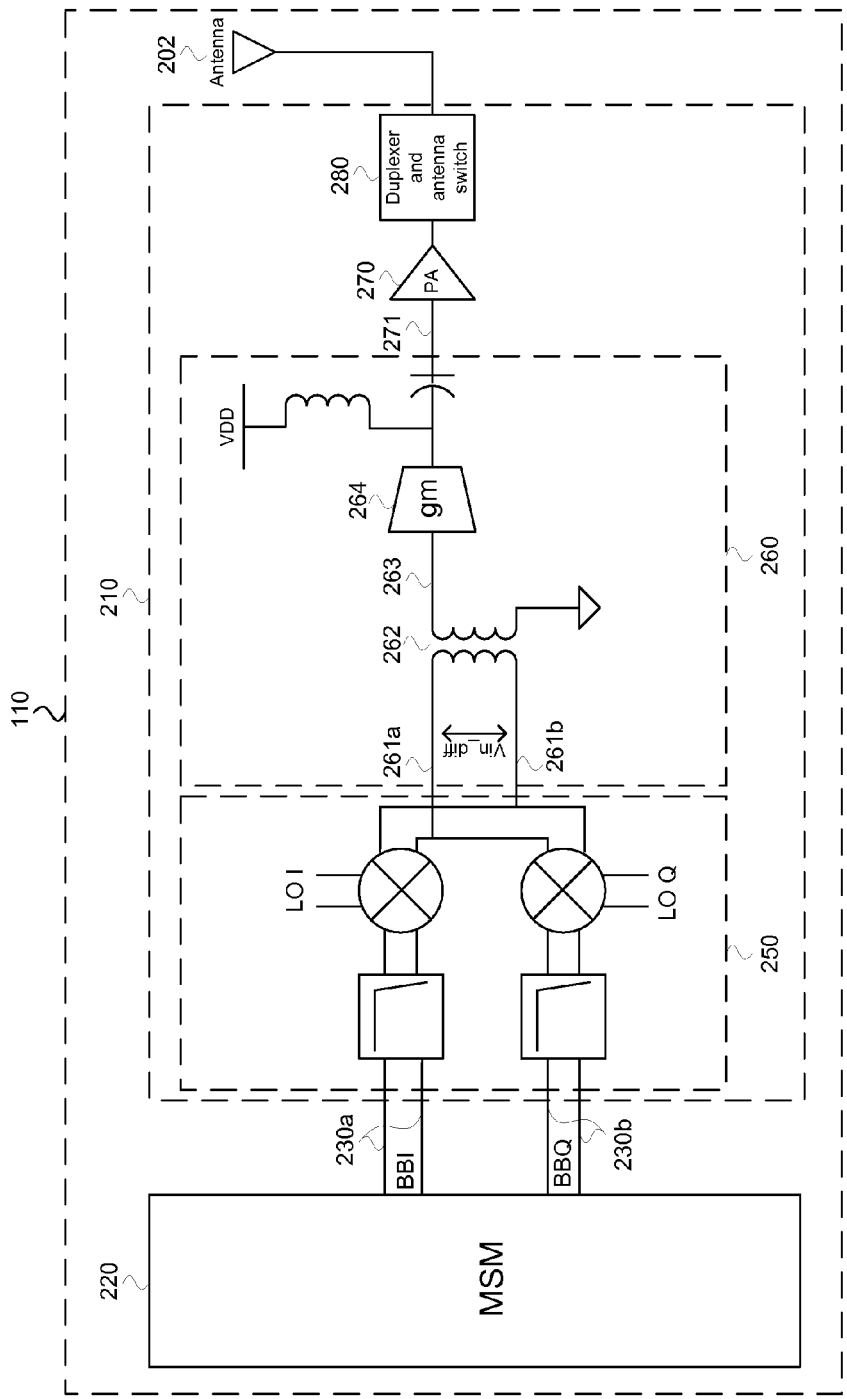
FIG. 2 illustrates an exemplary wireless device using prior art techniques.

FIG. 2 is a block diagram illustrating an exemplary wireless device 110. Wireless device 110 includes a transceiver system 210 which at one end couples to an antenna 202, such as a main antenna, which may be an external antenna, and at the other end couples to a mobile station modem (MSM) 220, such as via paths 230a and 230b. Paths 230a and 230b are used to respectively provide the transceiver system 210 with base-band in-phase (BBI) and base-band quadrature (BBQ) communications from the MSM 220.

As shown in FIG. 2, transceiver system 210 comprises a quadrature up-converter 250 coupled to a passive differential to single-ended converter circuit 260, which is in turn coupled to one or more power amplifiers 270, which are coupled to a duplexer and antenna switch unit 280. The BBI and BBQ communications received from the MSM 220 via paths 230a and 230b are up-converted to radio-frequencies in a manner well known in the art, and then respectively received in the differential to single-ended converter circuit 260 as differential inputs 261a and 261b, having a voltage differential vin_diff. As described below, the differential to single-ended converter circuit 260 then converts the differential outputs 261a and 261b into a single output 271, which is then amplified by the power amplifier(s) 270 and sent via the duplexer and antenna switch unit 280 to the antenna 202 for transmission.

In wide-spread prior art implementations of the differential to single-ended converter 260, a passive transformer 262 is used to effectuate the conversion to single voltage output 263. A voltage to current converter 264 then converts the voltage output 263 into a current output 264 that is inputted to the power amplifier(s) 270. As described above, passive transformers are often large in area, and require tuning to operate for different frequency bands. In some cases more than one transformer 262 is required for a complicated transmitter that has different signal paths. For example the typical die area of such a transformer is about 600 um by 600 um. A dual band solution could require two transformers requiring a total silicon area equal to 0.72 mm². These transformers thus not only occupy relatively large silicon die area but also can couple magnetically to other sensitive circuits such as voltage controlled oscillators (not shown), low noise amplifiers (not shown) etc to cause interferences with these circuit, such as in form of added noise.

Figure 3A:
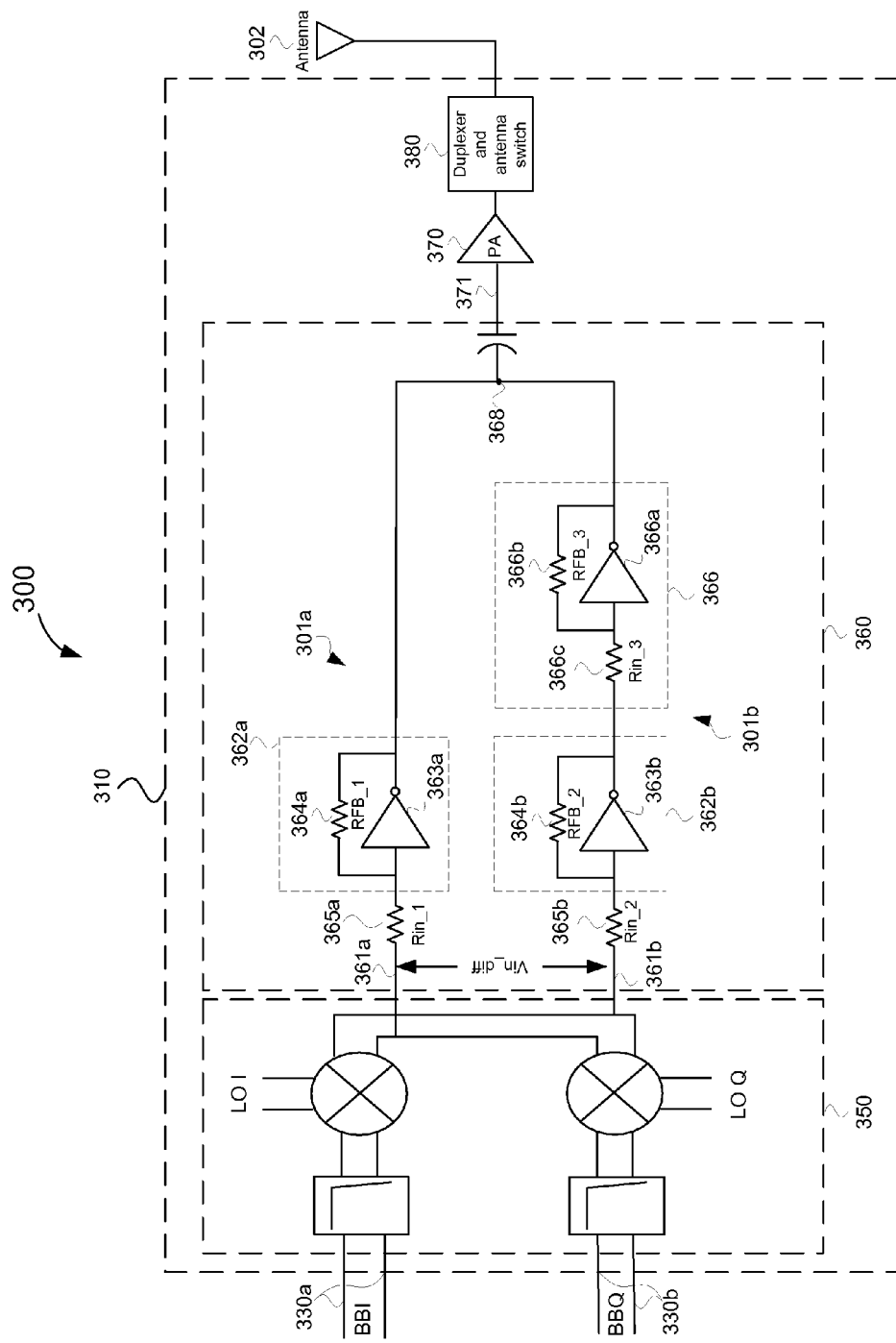
FIGS. 3A-C illustrate exemplary embodiments of the disclosure implemented in an exemplary wireless device.
Figure 3B:
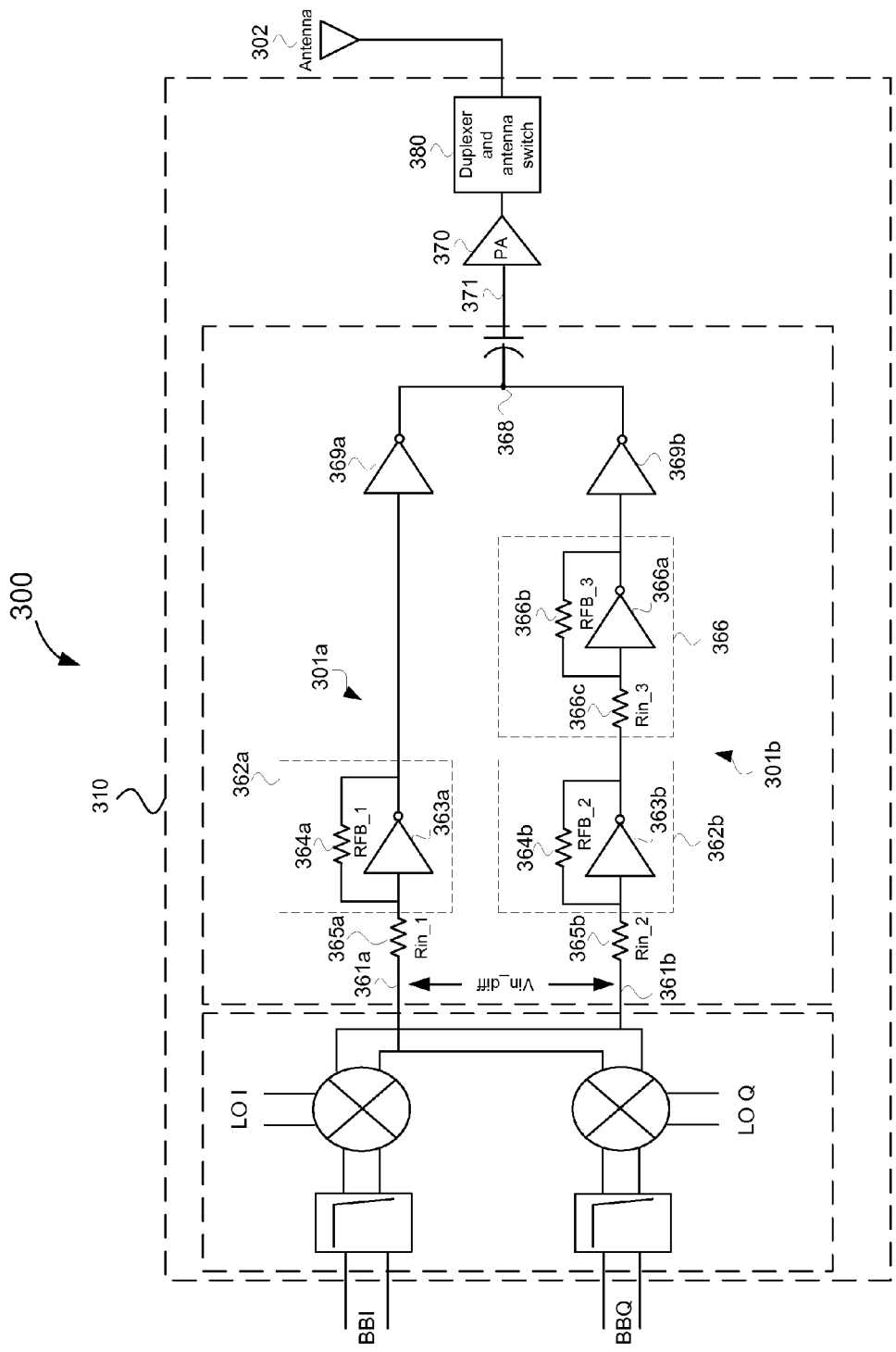

FIGS. 3A-B illustrates exemplary embodiments of the disclosure implemented in an exemplary wireless device 300. Wireless device 300 includes a transceiver system 310 which at one end couples to an antenna 302, such as a main antenna, which may be an external antenna, and at the other end couples to a mobile station modem (not shown), such as via paths 330a and 330b. Paths 330a and 330b are used to respectively provide the transceiver system 310 with base-band in-phase (BBI) and base-band quadrature (BBQ) communications from the mobile station modem.

Transceiver system 310 comprises a quadrature up-converter 350 coupled to an active differential to single-ended converter circuit 360, which is in turn coupled to one or more power amplifiers 370 which are coupled to a duplexer and antenna switch unit 380. The BBI and BBQ communications received via paths 330a and 330b are up-converted to radio-frequencies in a manner well known in the art, and then are respectively received in the active differential to single-ended converter circuit 360 as differential inputs 361a and 361b. As described below, the differential to single-ended converter 360 then converts the differential inputs 361a and 361b into a single output 371, as described in further detail below, which is then amplified by the power amplifier(s) 370 and sent via the duplexer and antenna switch unit 380 to the antenna 302 for transmission.

Exemplary embodiments of the active differential to single-ended converter circuit 360 will now be described in greater detail in conjunction with FIGS. 3A-C and FIG. 4. As shown in FIG. 3A, active differential to single-ended converter circuit 360 includes a plurality of inputs, such as inputs 361a and 361b, each of which follow a path, such as non-inverting path 301a and inverting path 301b, respectively, to a combiner node 368, as described in greater detail below. Each of 361a and 361b inputs receives from the quadrature up-converter 350 a radio frequency waveform, such as waveforms 401a and 401b, respectively, as shown by the waveform diagrams 400 of FIG. 4. Waveforms 401a and 401b may correspond to communication signals containing data or voice communication. As also shown in FIG. 4, waveforms 401a and 401b are phase-opposed (i.e. 180 degrees out of phase) with respect to each other. In an exemplary embodiment, the waveforms 401a and 401b are of the same amplitude "A" but phase-opposed.

Returning to FIG. 3A, the active differential to single-ended converter circuit 360 further includes a plurality of buffers, such as buffers 362a and 362b to receive differential input waveforms, such as waveforms 401a and 401b, respectively. The buffers 362a and 362b may or may not be inverting buffers. In the exemplary embodiments shown in FIGS. 3A-C, each of the buffers 362a and 362b is an inverting buffer, which may include an inverting unit, such as inverters 363a and 363b, respectively, with each inverter having its output connected to its input via a feedback resistor, such as RFB_1 364a for inverter 363a, and RFB_2 364b for inverter 363b.

The received differential input waveforms may be voltage waveforms having a voltage differential vin_diff, or may be current waveforms. In an exemplary embodiment in which the differential input waveforms are current waveforms, the resistors Rin_1 365a and Rin_2 365b are not implemented in the active differential to single-ended converter circuit 360 and the differential input waveforms received from the quadrature up-converter 350 are then directly received in the buffers 362a and 362b, respectively. In this exemplary embodiment, the buffers 362a and 362b are capable of converting their respective current waveforms into corresponding voltage waveforms.

The active differential to single-ended converter circuit 360 further includes an inverting circuit 366 coupled to an output of one of the buffers 362a and 362b, such as to buffer 362b as shown in FIG. 3A. The inverter circuit 366 inverts buffered waveform received from buffer 362b. As shown in FIG. 4, the waveform 401c corresponding to the output of inverter circuit 366 is the inverted form of waveform 401b. Since prior to the inversion the waveform 401b was phase-opposed to non-inverted differential input waveform 401a, the resulting inverted waveform 401c is now at the same phase or substantially the same phase as the non-inverted differential input waveform 401a, which corresponds to the output of buffer 362a.

In an exemplary embodiment, the inverter circuit 366 may include an inverter 366a whose output is connected to its input via a feedback resistor 366b. An input resistor 366c also connects to the input of inverting 366a at one end and to the input of the inverter circuit 366 at the opposite end. In an exemplary embodiment, the feedback resistor 366b and the input resistor 366c have the same resistance value so that gain of the inverter circuit 366 becomes −1.

As shown in FIG. 3A, the outputs of the inverter circuit 366 and buffer 362a are then joined at a combiner node 368 which combines the inverted and the non-inverted input waveforms into a single output waveform. In an exemplary embodiment, the combiner node 368 is effectively a summation node for waveforms outputted from inverter circuit 366 and buffer 362a such that the resulting waveform has an amplitude equaling to the sum of the amplitudes of the separate waveforms outputted from inverter circuit 366 and buffer 362a. In an exemplary embodiment, the waveforms 401a and 401c have the same amplitude "A", and thus the resulting waveform from the summation node, shown as 401d in FIG. 4, has an amplitude "2A", equaling twice that of the "A" amplitude of either 401a or 401c waveforms. In an exemplary embodiment, at the combiner node 368, a magnitude of a gain corresponding to a combination of the inverter circuit 366 coupled to the buffer 362b (i.e. gain of path 301a) is substantially equal to a magnitude of a gain corresponding to the buffer 362a (i.e. gain of path 301b). The output of the combiner node 368 is then outputted from the output 371 of the active differential to single-ended converter circuit 360, to the power amplifier(s) 370 for eventual transmission by the antenna 302.

FIG. 3B illustrates another exemplary embodiment in which the outputs of inverter circuit 366 and buffer 362a are each coupled to an amplifier, such as to amplifiers 369a and 369b placed along paths 301a and 301b, respectively, to amplify their respective waveforms. Amplifiers 369a and 369b may be inverting or non-inverting amplifiers. The outputs of the amplifiers 369a and 369b are then joined in the combiner node 368 in the manner described in conjunction with FIG. 3A.

Figure 3C:
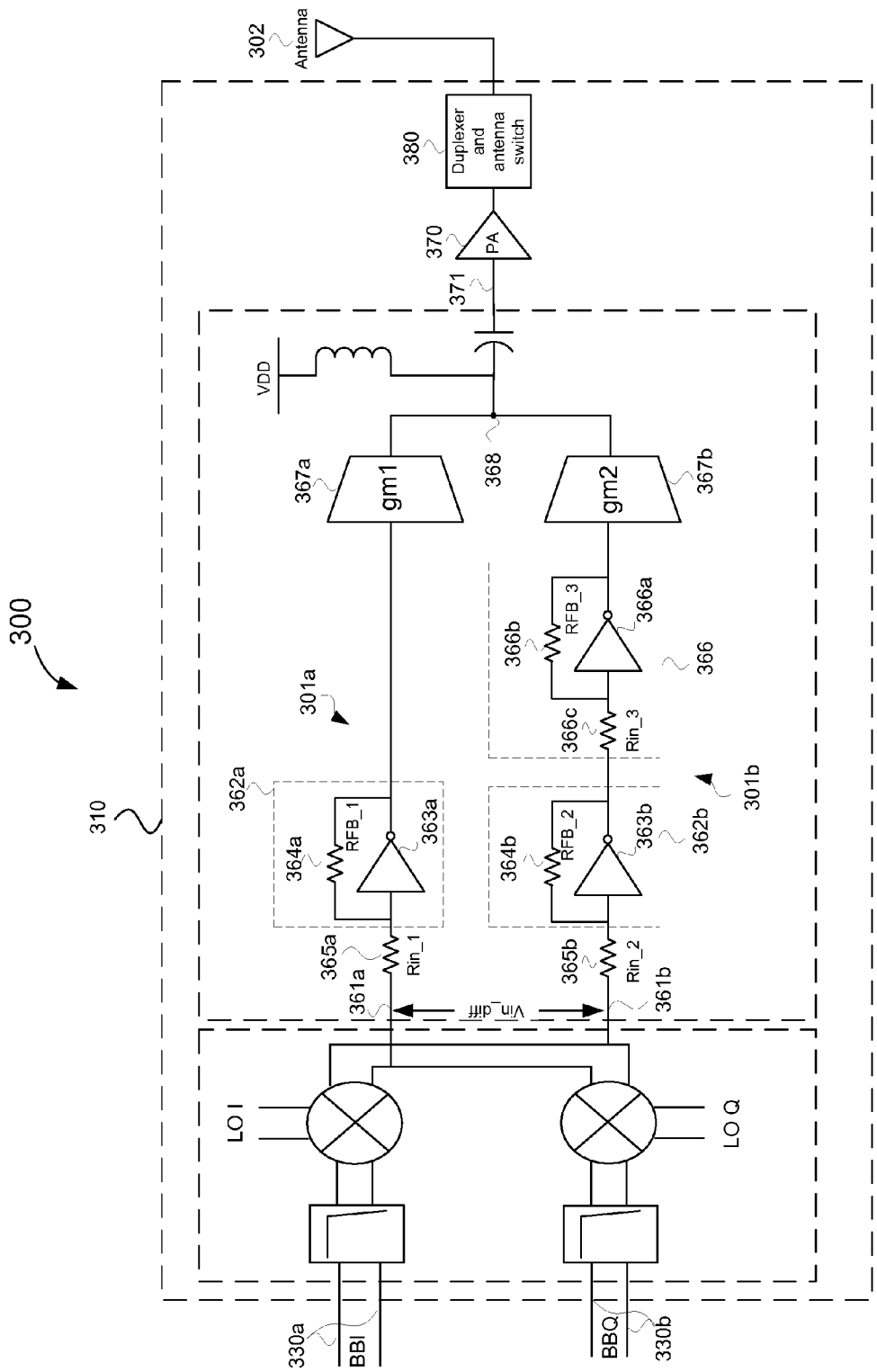
Figure 4:
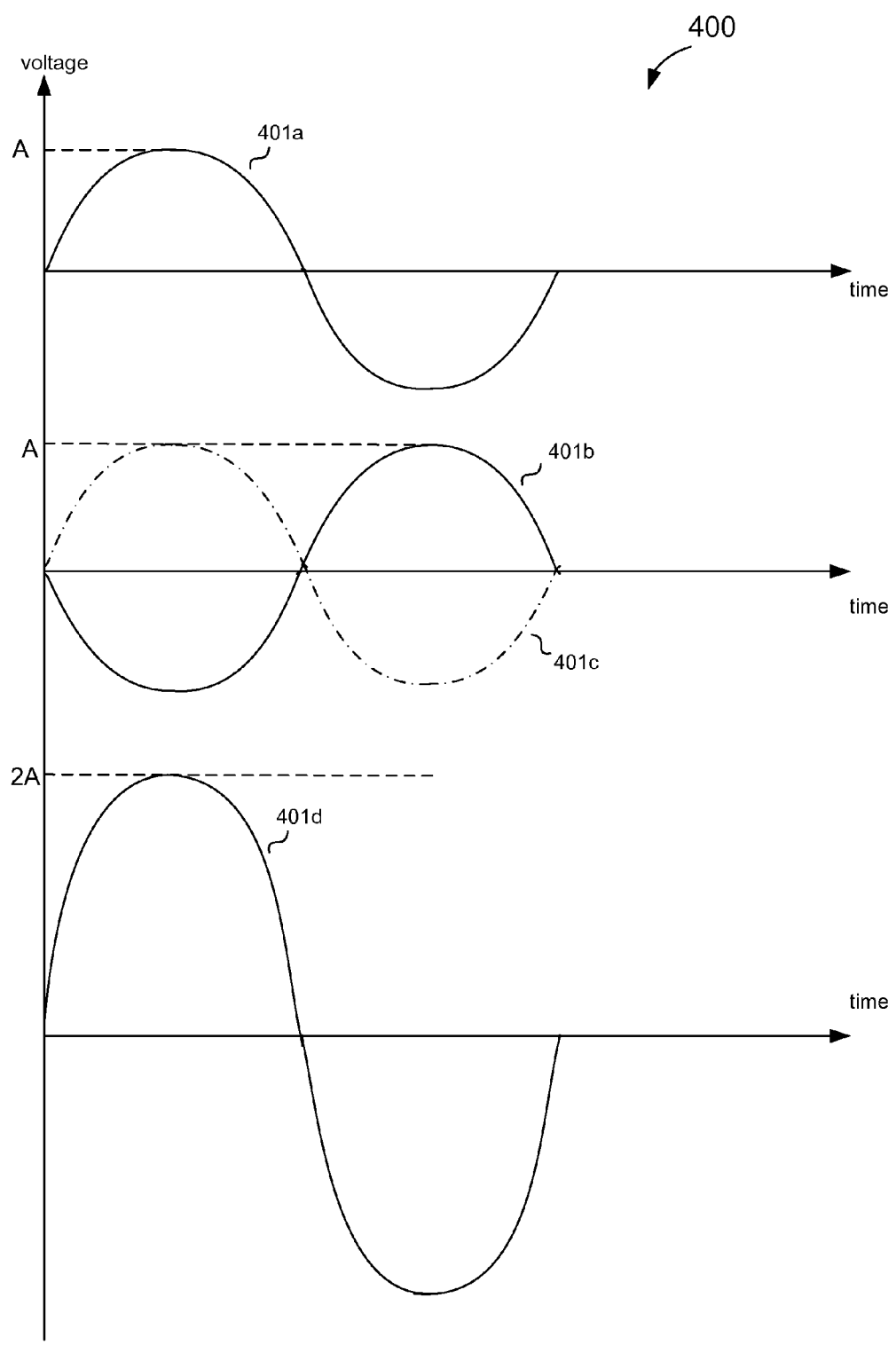
FIG. 4 illustrates exemplary phase-opposed and in-phase voltage waveforms.

FIG. 3C illustrates another exemplary embodiment in which the active differential to single-ended converter circuit 360 further includes a pair of voltage-to-current converters, such as 367a and 367b, placed along paths 301a and 301b, respectively. One of the voltage-to-current converters, such as 367b, is coupled to an output of the inverter circuit 366 to convert the inverted voltage waveform, such as waveform 401c, to a corresponding current waveform. The second voltage-to-current converter, such as 367a, is coupled to the buffer 362a to convert the non-inverted voltage waveform, such as waveform 401a, into a corresponding current waveform. The outputs of the voltage-to-current converters 367a and 367b are then joined in the combiner node 368 in the manner described in conjunction with FIG. 3A.

It should be noted that in the exemplary embodiments, any combination and number of inverting and non-inverting circuit components, such inverting buffers, amplifiers etc, may be used along each of paths 301a and 301b so long as the resulting waveform of paths 301b and 301a are in-phase before entering the combiner node 368.

Figure 5A:
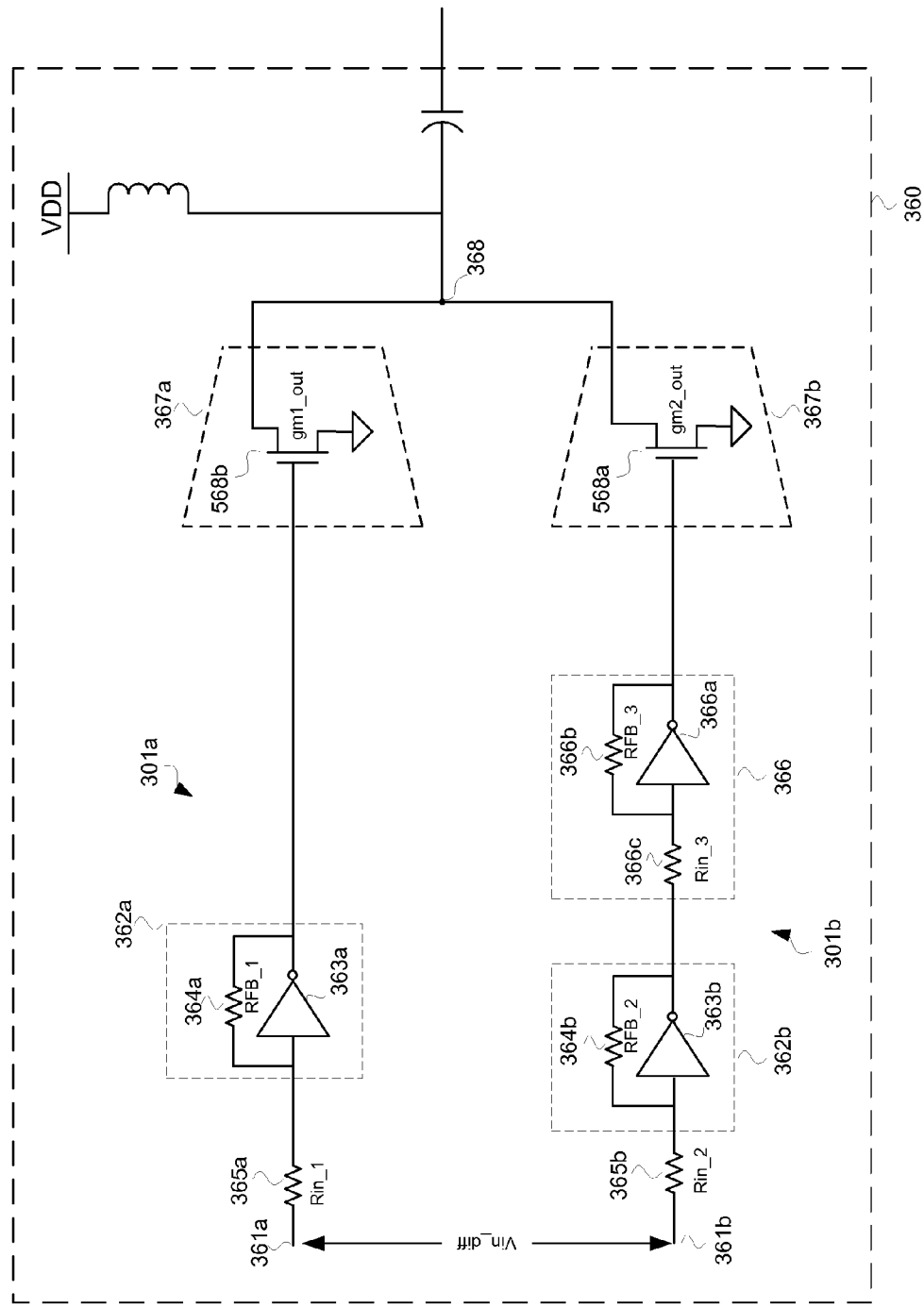
FIGS. 5A-B illustrate various exemplary embodiments of the disclosure.
Figure 5B:
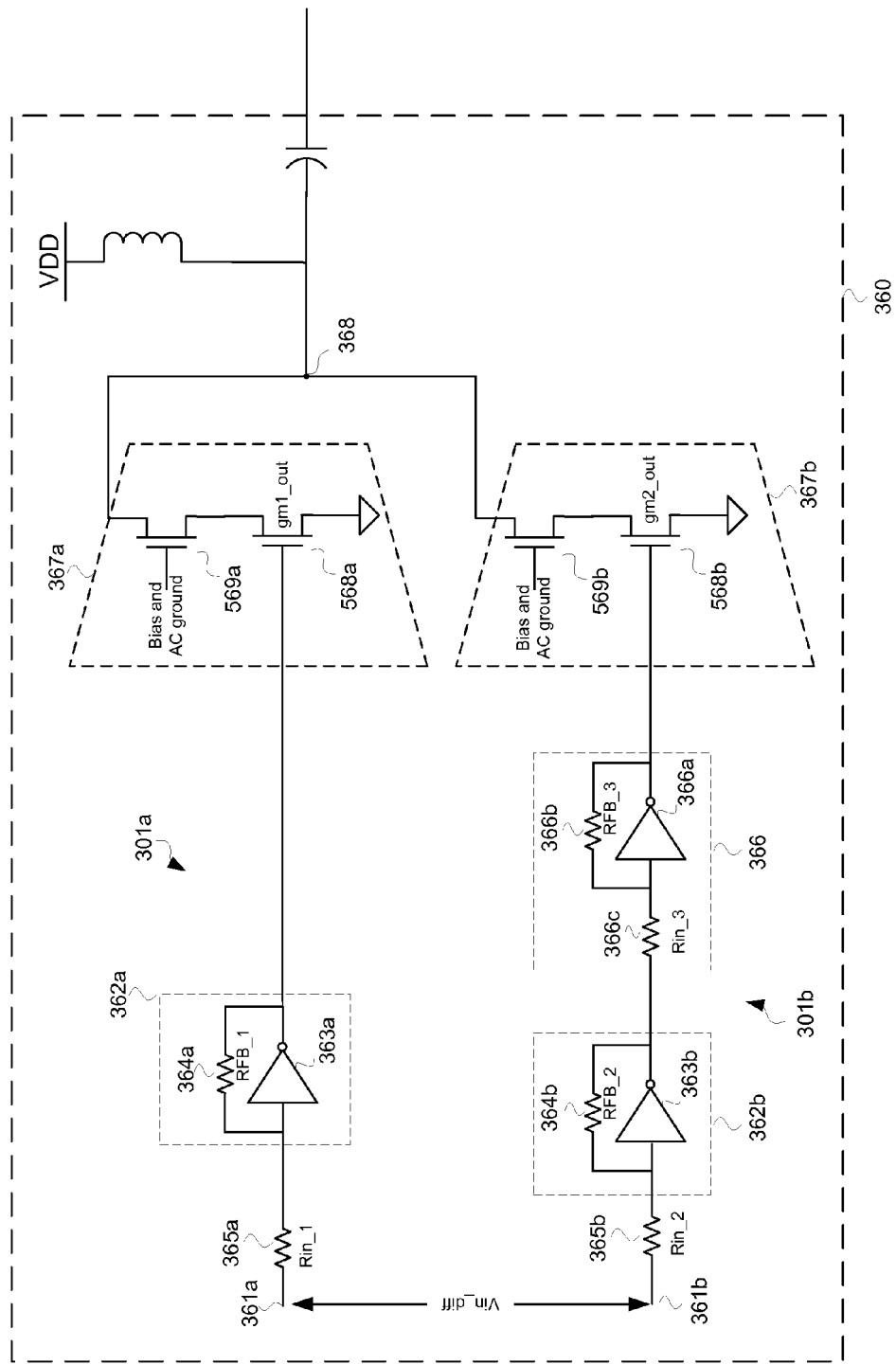

FIGS. 5A-B illustrate various exemplary embodiments of the voltage-to-current converters 367a and 367b used in the active differential to single-ended converter circuit 360 shown in FIG. 3C. In an exemplary embodiment shown in FIG. 5A, each of the voltage-to-current converters 367a and 367b comprise a transistor, such as 586a and 586b, respectively. In an exemplary embodiment, the transistors 586a and 586b are metal-oxide (MOS) field effect transistors (MOSFET), although other transistor types such as bi-polar junction (BJT), complimentary MOS (CMOS), GaAs Metal Semi-conductor field effect MESFET etc. may also be used and are contemplated to be within the scope of this disclosure. In an exemplary embodiment shown in FIG. 5B, each of the voltage-to-current converters 367a and 367b comprise a plurality of transistors, such as 586a, 569a, and 568b, 569b, arranged in a cascoded format. In an exemplary embodiment, transistors 586a, 569a, 568b, and 569b are metal-oxide (MOS) transistors.

In an exemplary embodiment, such as those shown in FIG. 3A-C, the gain achieved by the active differential to single-ended converter circuit 360 is a programmable gain. This may be achieved by for example changing (i.e. programming) the values of the various circuit components of active differential to single-ended converter circuit 360, such as one or more of resistors 364a, 365a, 365b, 364b, 366c, 366b and/or the gain, current value and size of one or more of the inverters 363a, 363b, 366a. With reference to the exemplary embodiments shown in FIG. 5A and FIG. 5B, further gain programmability can be achieved by changing (i.e. programming) the gain, current and size of one or more of transistors 568a, 568b, 569a and 569b.

Figure 6A:
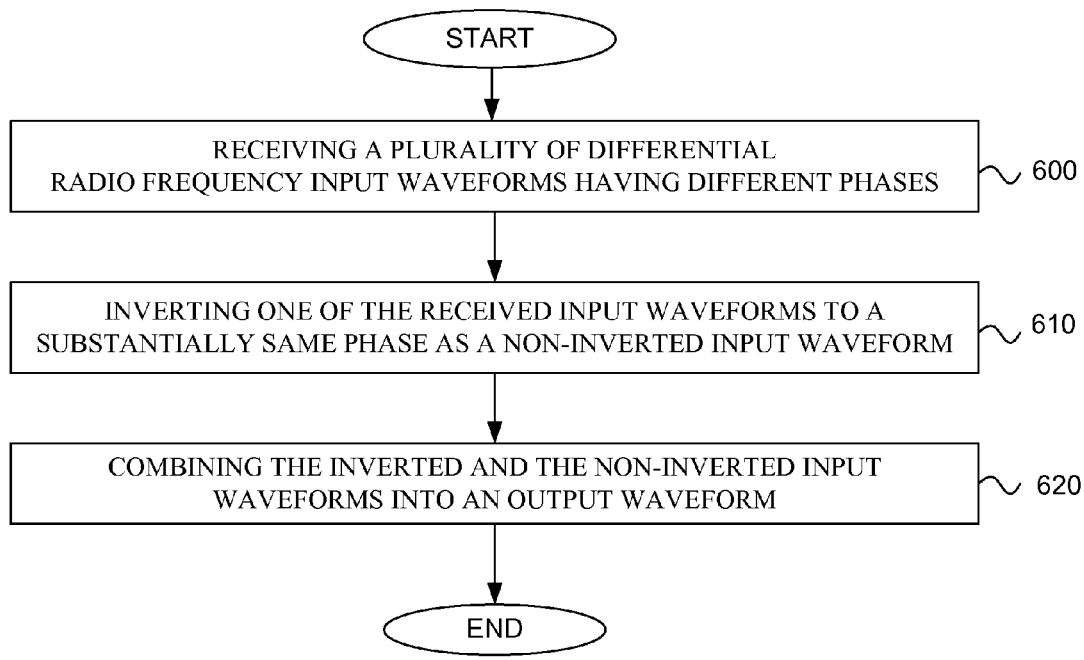
FIGS. 6A-D are flow charts illustrating exemplary methods of the disclosure.
Figure 6D:
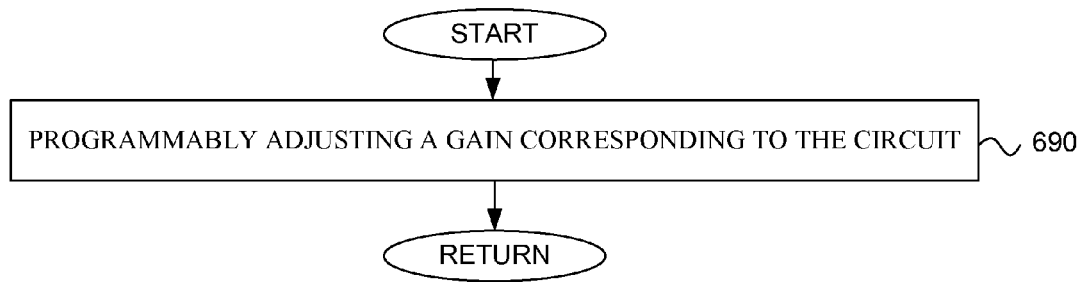
Figure 6B:
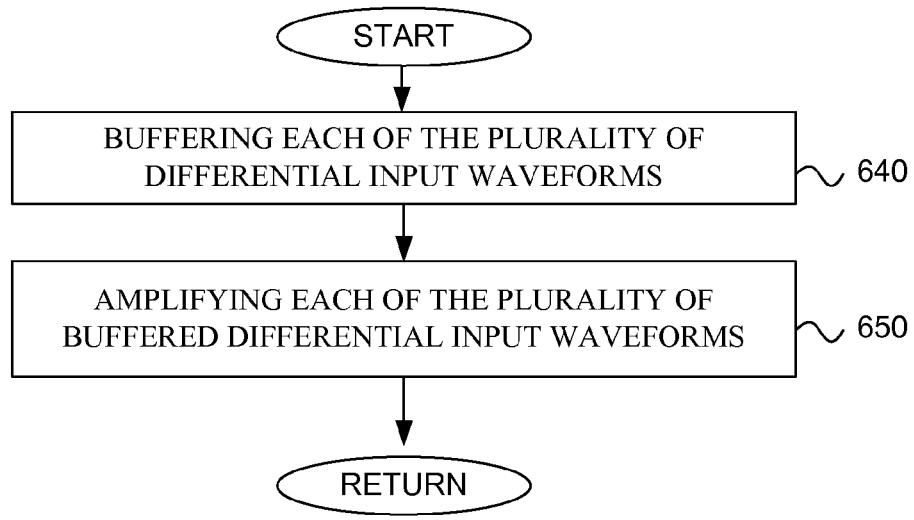
Figure 6C:
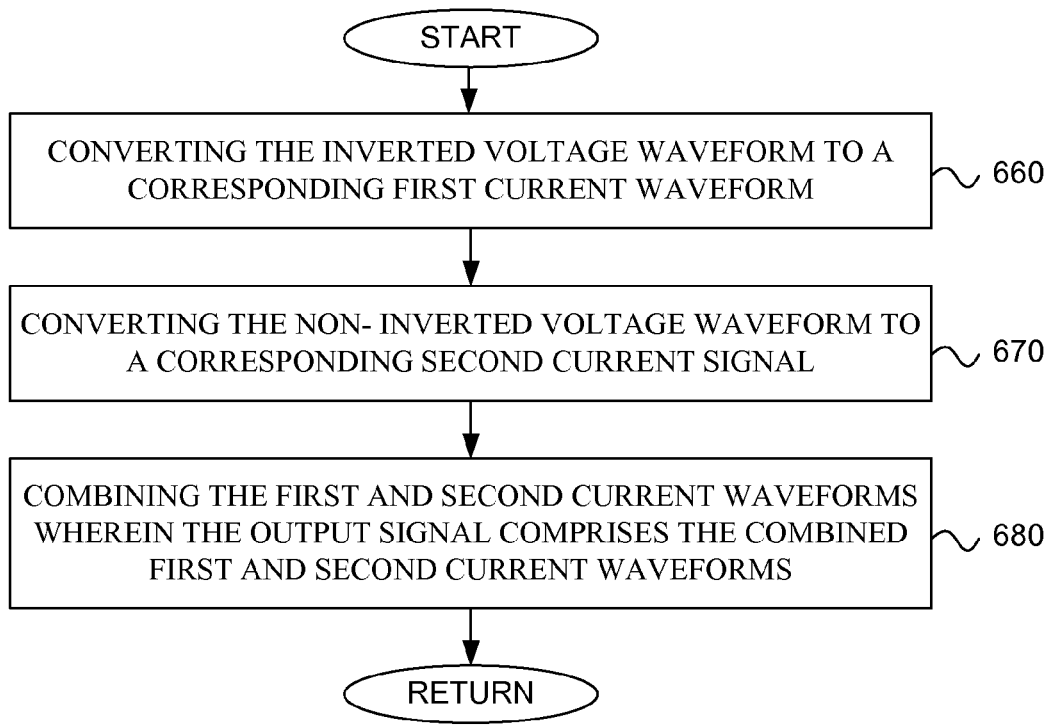

FIGS. 6A-C are flow charts which in conjunction with FIGS. 3A-C and FIG. 4 illustrate exemplary methods of the disclosure. As shown in FIG. 6A, the overall process begins at block 600 when a plurality of differential radio frequency input waveforms (such as waveforms 401a and 401b) having different phases, are received in the active differential to single-ended converter circuit 360. In an exemplary embodiment, the received differential radio frequency input waveforms are phase-opposed with respect to each other, and can be voltage waveforms or current waveforms. Next, in block 610, one of the received input waveforms, such as waveform 401b, is inverted to a waveform 401c having substantially same phase as a non-inverted input radio frequency waveform 401a. In an exemplary embodiment, the inverting is an actively inverting one of the received input waveforms to a substantially same phase as the non-inverted input radio frequency waveforms. Next, in block 620, the inverted and the non-inverted waveforms are combined into an output waveform. The overall operations then end.

FIG. 6B illustrates in further detail the receiving operations described in block 600 of FIG. 6A. As shown in FIG. 6B, in block 640 the plurality of differential input waveforms are buffered, such as in buffers 362a and 362b. Next, in block 650, the buffered differential input waveforms are amplified, such as by the buffers 362a and 362b. The process is then returned to block 600 of FIG. 6A.

FIG. 6C illustrates in further detail the combining operations described in block 620 of FIG. 6A. As shown in FIG. 6C, in block 660 the inverted voltage waveform, such as waveform 401c, is converted to a corresponding current waveform, such as by the voltage-to-current converter 367b shown in FIG. 3C. Next, in block 670, the non-inverted voltage waveform, such as waveform 401a, is converted to a corresponding current waveform, such as by the voltage-to-current converter 367a shown in FIG. 3C. Next, in block 680, the converted current waveforms are combined, such as in the combiner node 368, to a single output waveform. The process is then returned to block 620 of FIG. 6A.

FIG. 6D illustrates additional features of operations described in blocks 600, 610 and 620 of FIG. 6A. As shown in FIG. 6D, in block 690 a gain corresponding to the active differential to single-ended converter circuit 360 can be programmably adjusted as described above. The process is then returned to one or more of blocks 600, 610 or 620 of FIG. 6A based on the application of gain adjustment to the some or all of the components of active differential to single-ended converter circuit 360.

Figure 7A:
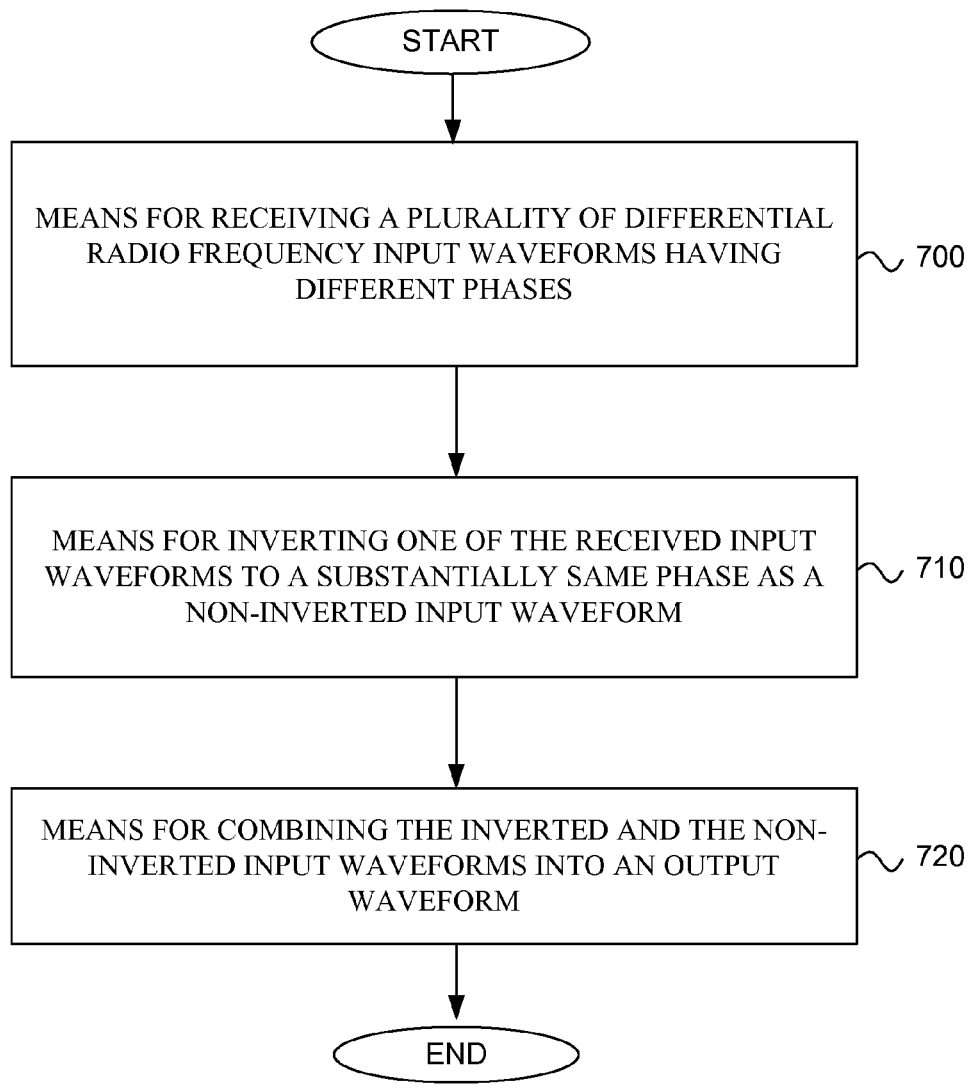
FIGS. 7A-C are functional block diagrams illustrating the flow of operations executed by exemplary embodiments of the disclosure.
Figure 7B:
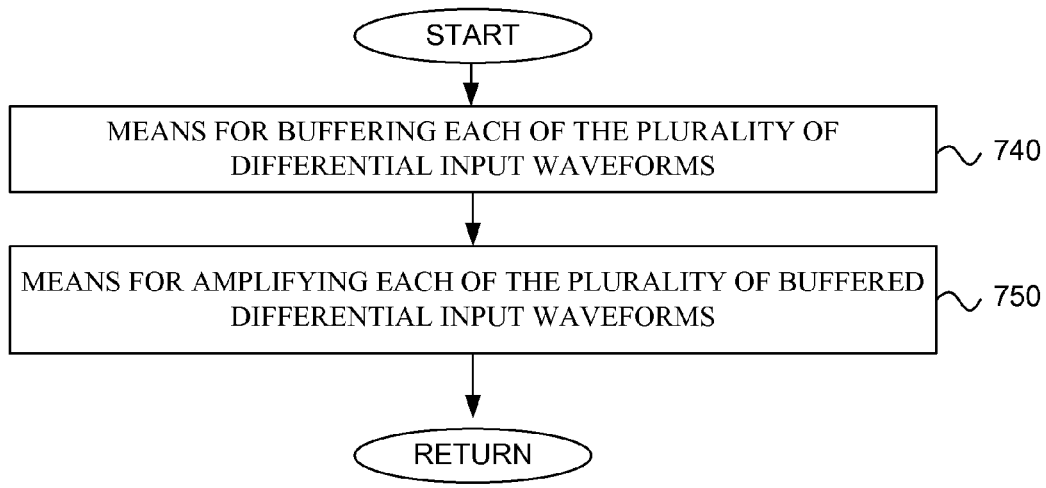
Figure 7C:
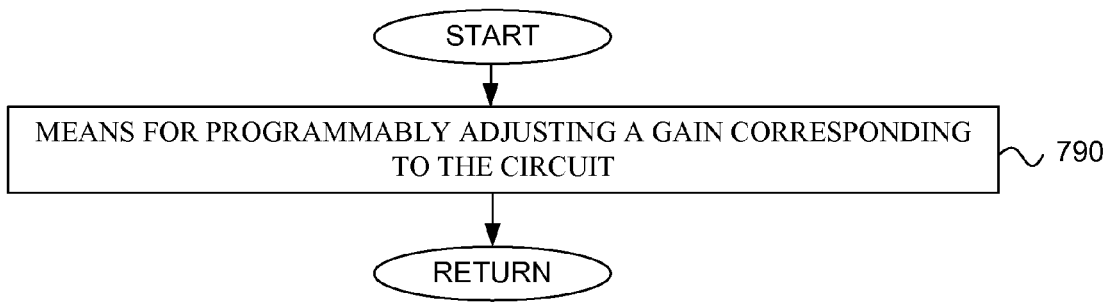

FIGS. 7A-C are functional block diagrams illustrating the flow of operations executed by exemplary embodiments of the disclosure, as described above in conjunction with FIG. 3A through FIG. 6D. Starting with block 700 of FIG. 7A, exemplary means for receiving a plurality of differential frequency waveforms input waveforms, each differential frequency waveforms input waveform received at a different input, may include the nodes 361a and 361b as shown in and described in conjunction with FIGS. 3A-C. Next, in block 710, exemplary means for inverting a waveform from the plurality of differential inputs waveforms to a substantially same phase as a non-inverted differential input waveform may include an inverting circuit 366 coupled to an output of one of the buffers 362a and 362b, such as to buffer 362b as shown in and described in conjunction with FIGS. 3A-C. Next, in block 720, exemplary means for combining the inverted and the non-inverted input waveforms into an output waveform may include node the combiner node 368 at which the outputs of the inverter circuit 366 and buffer 362a are then joined. As shown in and described in conjunction with FIGS. 3A-C the combiner node 368 then combines the inverted and the non-inverted input waveforms into a single output waveform.

FIG. 7B illustrates in further detail the operations described in block 700 of FIG. 7A. As shown in FIG. 7B, in block 740 exemplary means for buffering each differential input waveform from the plurality of input waveforms may include buffers 362a and 362b, as shown in and described in conjunction with FIGS. 3A-C. Next, in block 750, exemplary means for amplifying each of the plurality of buffered differential input waveforms may include the buffers 362a and 362b, as shown in and described in conjunction with FIGS. 3A-C.

FIG. 7C illustrates additional features of operations described in blocks 700, 710 and 720 of FIG. 7A. As shown in FIG. 7C, in block 790 exemplary means for programmably adjusting a gain corresponding to the circuit, may include changing (i.e. programming) the values of the various circuit components of active differential to single-ended converter circuit 360, such as one or more of resistors 364a, 365a, 365b, 364b, 366c, 366b and/or the gain, current value and size of one or more of the inverters 363a, 363b, 366a. With reference to the exemplary embodiments shown in FIG. 5A and FIG. 5B, further gain programmability can be achieved by changing (i.e. programming) the gain, current and size of one or more of transistors 568a, 568b, 569a and 569b as shown in and described in conjunction with FIGS. 3A-C. The process is then returned to one or more of blocks 700, 710 or 720 of FIG. 7A based on the application of gain adjustment to the some or all of the components of active differential to single-ended converter circuit 360.

It should be noted that the various exemplary embodiments were discussed separately for purposes of illustrations, but that they maybe combined in one embodiment having some or all of the features of the separately illustrated embodiments.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

It should be noted that the methods described above can be implemented in computer program product having a computer-readable medium with code for causing a computer to perform the above described processes. In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but are to be accorded the widest scope consistent with the principles and novel features disclosed herein.

What is claimed is:

1. A method comprising:
   receiving a plurality of differential radio frequency input voltage waveforms having different phases;
   inverting one of the received input waveforms to a substantially same phase as a non-inverted input waveform; and
   combining the inverted input waveform and the non-inverted input waveform into an output waveform, the inverted input waveform and the non-inverted input waveform including independent programmable gain control.

2. The method of claim 1, further comprising:
   programmably adjusting a gain corresponding to the circuit.

3. The method of claim 2, the combining further comprising:
   converting the inverted voltage waveform to a corresponding first current waveform;
   converting the non-inverted voltage waveform to a corresponding second current waveform; and
   combining the first and second current waveforms wherein the output waveform comprises the combined first and second current waveforms.

4. The method of claim 1, the receiving further comprising:
   buffering each of the plurality of differential input waveforms; and
   amplifying each of the plurality of buffered differential input waveforms.

5. A circuit comprising:
   a plurality of inputs, each input to receive a radio frequency voltage waveform from a plurality of differential input waveforms having different phases;
   an inverter circuit to invert a waveform from the plurality of differential inputs waveforms to a substantially same phase as a non-inverted input waveform; and
   a combiner node to combine the inverted and the non-inverted input waveforms into an output waveform, the inverted input waveform and the non-inverted input waveform including independent programmable gain control.

6. The circuit of claim 5, wherein the plurality of waveforms are at least one of a voltage waveforms and a current waveforms.

7. The circuit of claim 5, further comprising:
   a plurality of buffers, each buffer to receive a differential input waveform from the plurality of input waveforms.

8. The circuit of claim 7, wherein an input to the inverter circuit is coupled to an output of a first buffer from the plurality of buffers and wherein the inverter circuit inverts a buffered waveform received from the first buffer.

9. The circuit of claim 8, further comprising:
   a first voltage-to-current converter coupled to an output of the inverter circuit to convert an inverted voltage waveform to a corresponding first current waveform; and
   a second voltage-to-current converter coupled to a second buffer from the plurality of buffers to convert a non-inverted voltage waveform into a corresponding second current waveform.

10. The circuit of claim 8, further comprising:
    a first amplifier coupled to an output of the inverter circuit to amplify an inverted voltage waveform; and
    a second amplifier coupled to a second buffer from the plurality of buffers to amplify a non-inverted voltage waveform.

11. The circuit of claim 8, wherein a magnitude of a gain corresponding to a combination of the inverter circuit coupled to a first buffer from the plurality of buffers is substantially equal to a magnitude of a gain corresponding to a second buffer from the plurality of buffers.

12. The circuit of claim 7, wherein at least one of the plurality of buffers comprises an inverting buffer.

13. The circuit of claim 5, wherein the plurality of waveforms are phase-opposed with respect to each other.

14. The circuit of claim 5, wherein the inverter circuit comprises a gain of −1.

15. The circuit of claim 5, wherein a gain corresponding to the circuit is a programmable gain.

16. The circuit of claim 5, further comprising:
a plurality of buffers coupled to the plurality of inputs, each buffer to receive a differential input waveform from the plurality of input waveforms, wherein an input to the inverter circuit is coupled to an output of a first buffer from the plurality of buffers and wherein the inverter circuit inverts a buffered waveform received from the first buffer; and
a combiner node coupled to outputs of the first buffer, and to a second buffer from the plurality of buffers to combine the inverted waveform from received from the first buffer and the non-inverted input waveform received from the second buffer, into an output waveform.

17. A circuit comprising:
means for receiving a plurality of differential frequency voltage waveforms input waveforms, each differential frequency waveforms input waveform received at a different input;
means for inverting a waveform from the plurality of differential inputs waveforms to a substantially same phase as a non-inverted differential input waveform; and
means for combining the inverted input waveform and the non-inverted input waveform into an output waveform, the inverted input waveform and the non-inverted input waveform including independent programmable gain control.

18. The circuit of claim 17, further comprising:
means for buffering each differential input waveform from the plurality of input waveforms; and
means for amplifying each of the plurality of buffered differential input waveforms.

19. The circuit of claim 17, further comprising:
means for programmably adjusting a gain corresponding to the circuit.

20. A computer program product, comprising:
computer-readable medium comprising:
code for causing a computer to receive a plurality of differential radio frequency input voltage waveforms having different phases;
code for inverting one of the received input waveforms to a substantially same phase as a non-inverted input radio frequency waveform; and
code for combining the inverted input waveform and the non-inverted input waveform into an output waveform, the inverted input waveform and the non-inverted input waveform including independent programmable gain control.

21. The computer program product of claim 20, the computer-readable medium further comprising:
code for buffering each of the plurality of differential input waveforms; and
code for amplifying each of the plurality of buffered differential input waveforms.

* * * * *